(12) United States Patent
Prechtl et al.

(10) Patent No.: US 8,735,289 B2
(45) Date of Patent: May 27, 2014

(54) METHOD OF CONTACTING A DOPING REGION IN A SEMICONDUCTOR SUBSTRATE

(75) Inventors: Gerhard Prechtl, Ross (AT); Andreas Peter Meiser, Sauerlach (DE); Thomas Ostermann, Koestenberg (AT)

(73) Assignee: Infineon Technologies AG, Neubiberg (DE)

( * ) Notice: Subject to any disclaimer, the term of this patent is extended or adjusted under 35 U.S.C. 154(b) by 206 days.

(21) Appl. No.: 12/955,195

(22) Filed: Nov. 29, 2010

(65) Prior Publication Data

US 2012/0133024 A1    May 31, 2012

(51) Int. Cl.
*H01L 21/44*      (2006.01)

(52) U.S. Cl.
USPC .... 438/672; 438/666; 438/675; 257/E21.577; 257/E21.579; 257/E21.585; 257/E21.586

(58) Field of Classification Search
USPC ............ 438/672, 675, 666; 257/E21.577, 257/E21.579, E21.585, E21.586
See application file for complete search history.

(56) References Cited

U.S. PATENT DOCUMENTS

| 5,521,409 | A | 5/1996 | Hshieh et al. |
| 5,922,515 | A * | 7/1999 | Chiang et al. ............... 430/312 |
| 6,184,128 | B1 * | 2/2001 | Wang et al. .................. 438/637 |
| 6,436,781 | B2 * | 8/2002 | Sato ............................. 438/350 |
| 6,545,301 | B2 * | 4/2003 | Kamimura .................... 257/222 |

FOREIGN PATENT DOCUMENTS

| DE | 102004046697 A1 | 4/2006 |
| WO | 9952137 A1 | 10/1999 |

OTHER PUBLICATIONS

Jaeger, Richard C., "Introduction to Microelectronic Fabrication", vol. V, Second Edition, Prentice Hall, 2002 p. 256f.
Ning, Tak H., "History and Future Perspective of the Modern Silicon Bipolar Transistor", IEEE Transactions on Electron Devices, vol. 48, No. 11, Nov. 2001, pp. 2485-2491.

* cited by examiner

*Primary Examiner* — Robert Huber
(74) *Attorney, Agent, or Firm* — Murphy, Bilak & Homiller, PLLC

(57) ABSTRACT

According to an embodiment, a method for manufacturing a semiconductor device is provided. The method includes providing a mask layer which is used as an implantation mask when forming a doping region and which is used as an etching mask when forming an opening and a contact element formed in the opening. The contact element is in contact with the doping region.

10 Claims, 13 Drawing Sheets

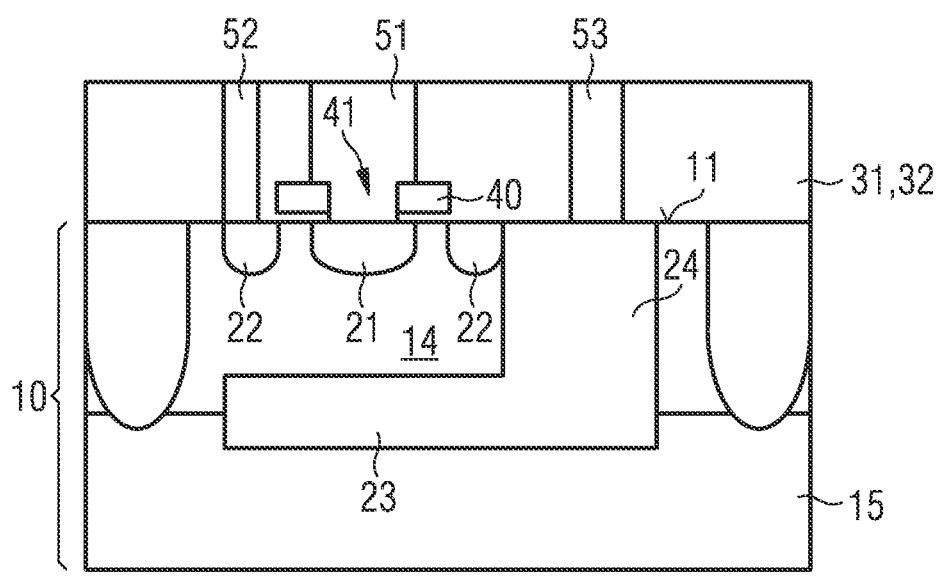

METHOD OF CONTACTING A DOPING REGION IN A SEMICONDUCTOR SUBSTRATE

FIELD OF THE INVENTION

The embodiments described herein relate to semiconductor devices, and more particularly to semiconductor devices having a doping region aligned with respect to a contact element in electrical contact with the doping region and methods of manufacturing the same.

BACKGROUND

Semiconductor devices such as bipolar transistors are used for many applications. Bipolar transistors often have insufficient emitter efficiency due to process variations. For example, lateral misalignment between the emitter contact and the emitter results in a reduction of the lateral emitter width which can lead to an increased recombination rate at the emitter contact. The closer the emitter contact is to an edge of the emitter, the higher the recombination rate. A high recombination rate also deteriorates the emitter efficiency and reduces the gain of the bipolar transistor. Furthermore, other transistor parameters can also vary. Typically, laborious design rules are required in an attempt to compensate these effects, for example by increasing the used chip area which also increases the production costs.

SUMMARY

According to one embodiment, a method for manufacturing a semiconductor device is provided. The method includes providing a semiconductor substrate comprising a first surface; forming a first insulating layer on the first surface of the semiconductor substrate; forming a mask layer having a first opening on the first insulating layer, the first opening of the mask layer defining a location of a first doping region; performing a first implantation step using the mask layer as implantation mask to form the first doping region in the semiconductor substrate; etching the first insulating layer selectively with respect to the mask layer to expose a portion of the first doping region by forming a first opening in the first insulating layer using the mask layer as etching mask; forming a second insulating layer on the mask layer to cover the first opening in the mask layer, the material of the first and second insulating layers being selectively etchable with respect to the material of the mask layer; forming an etching mask on the second insulating layer for defining at least a first opening in the second insulating layer above the first opening of the mask layer; etching the second insulating layer selectively with respect to the etching mask and the mask layer to form the first opening in the second insulating layer, the first opening of the second insulating layer exposing the first opening in the mask layer; and depositing a conductive material to form at least one contact element disposed in the first opening formed in the first insulating layer, the first opening formed in the second insulating layer and the first opening formed in the mask layer, the contact element being in contact with the first doping region and the mask layer.

According to one embodiment, a semiconductor device is provided. The semiconductor device includes a semiconductor substrate having a first surface and a first doping region. A first insulating layer having a first opening is disposed on the first surface of the semiconductor substrate, the first opening being arranged above the first doping region. A mask layer on the first insulating layer includes a first opening. The first opening in the first insulating layer and the first opening in the mask layer are laterally centred with respect to the first doping region. A second insulating layer on the mask layer includes a first opening above the first opening of the mask layer. At least a first contact element is arranged in the first opening of the second insulating layer, the first opening of the mask layer and the first opening of the first insulating layer. The first contact element electrically connects the first doping region with the mask layer.

According to one embodiment, a method for manufacturing a semiconductor device is provided. The method includes providing a semiconductor substrate having a first surface, a first doping region and a second doping region laterally spaced to the first doping region, a first insulating layer on the first surface of the semiconductor substrate, and a conductive mask layer having at least a first opening and a second opening spaced apart from the first opening on the first insulating layer, the first opening of the conductive mask layer being arranged above the first doping region and the second opening of the conductive mask layer being arranged above the second doping region; forming a second insulating layer on the conductive mask layer to cover the first and second openings in the conductive mask layer, the material of the first and second insulating layers being selectively etchable with respect to the material of the conductive mask layer; forming an etching mask on the second insulating layer for defining a first opening and a second opening of the second insulating layer; etching the second insulating layer selectively with respect to the etching mask and the conductive mask layer to form the first opening and the second opening of the second insulating layer, the first opening of the second insulating layer exposing the first opening in the conductive mask layer, the second opening of the second insulating layer exposing the second opening in the conductive mask layer; etching the first insulating layer using the conductive mask layer as etching mask to form a first and a second opening in the first insulating layer for exposing at least a respective portion of the first and second doping region; and depositing a conductive material to form a first contact element disposed in the first opening formed in the first insulating layer, the first opening formed in the second insulating layer and the first opening formed in the conductive mask layer, and a second contact element disposed in the second opening formed in the first insulating layer, the second opening formed in the second insulating layer and the second opening formed in the conductive mask layer, the first contact element being in electrical contact with the first doping region and the conductive mask layer, and the second contact element being in electrical contact with the second doping region and the conductive mask layer.

According to one embodiment, a semiconductor device is provided. The semiconductor device includes a semiconductor substrate having a first surface, a first doping region and a second doping region laterally spaced apart from the first doping region. A first insulating layer is arranged on the first surface of the semiconductor substrate and includes a first opening and a second opening. A conductive mask layer on the first insulating layer has a first opening and a second opening. The first opening of the conductive mask layer is arranged above the first opening of the first insulating layer and the second opening of the conductive mask layer is arranged above the second opening of the first insulating layer. A second insulating layer on the conductive mask layer has a first opening and a second opening. The first opening of the second insulating layer is arranged above the first opening of the conductive mask layer, and the second opening of the second insulating layer is arranged above the second opening of the conductive mask layer. A first contact element is disposed in the first opening of the first insulating layer, the first opening of the conductive mask layer and the first opening of the second insulating layer, and a second contact element is disposed in the second opening of the first insulating layer, the second opening of the conductive mask layer and the second opening of the second insulating layer. The first contact element is in electrical contact with the first doping region and with the conductive mask layer, and the second contact element is in electrical contact with the second doping region and with the conductive mask layer.

According to one embodiment, a semiconductor device is provided. The semiconductor device includes a semiconductor substrate having a first surface, a doping area of a first conductivity type, a first doping region of the second conductivity type arranged in the doping area of the semiconductor substrate, and a contact doping region of the second conductivity type arranged in the first doping region at the first surface. The contact doping region has a higher doping concentration than the first doping region. A first insulating layer is on the first surface of the semiconductor substrate. The first insulating layer includes a first opening above the contact doping region. A mask layer on the first insulating layer includes a first opening. The first opening in the first insulating layer and the first opening in the mask layer are laterally centred with respect to the contact doping region. A second insulating layer on the mask layer includes a first opening above the first opening of the mask layer. At least one contact element is arranged in the first opening of the second insulating layer, in the first opening of the mask layer and in the first opening of the first insulating layer. The contact element electrically connects the contact doping region with the mask layer.

Those skilled in the art will recognize additional features and advantages upon reading the following detailed description, and upon viewing the accompanying drawings.

BRIEF DESCRIPTION OF THE SEVERAL VIEWS OF THE DRAWINGS

The components in the figures are not necessarily to scale, instead emphasis being placed upon illustrating the principles of the invention. Moreover, in the figures, like reference numerals designate corresponding parts. In the drawings:

FIGS. 3A to 3F illustrate processes of a method for manufacturing a semiconductor device according to one embodiment;

DETAILED DESCRIPTION

Figure 1A:
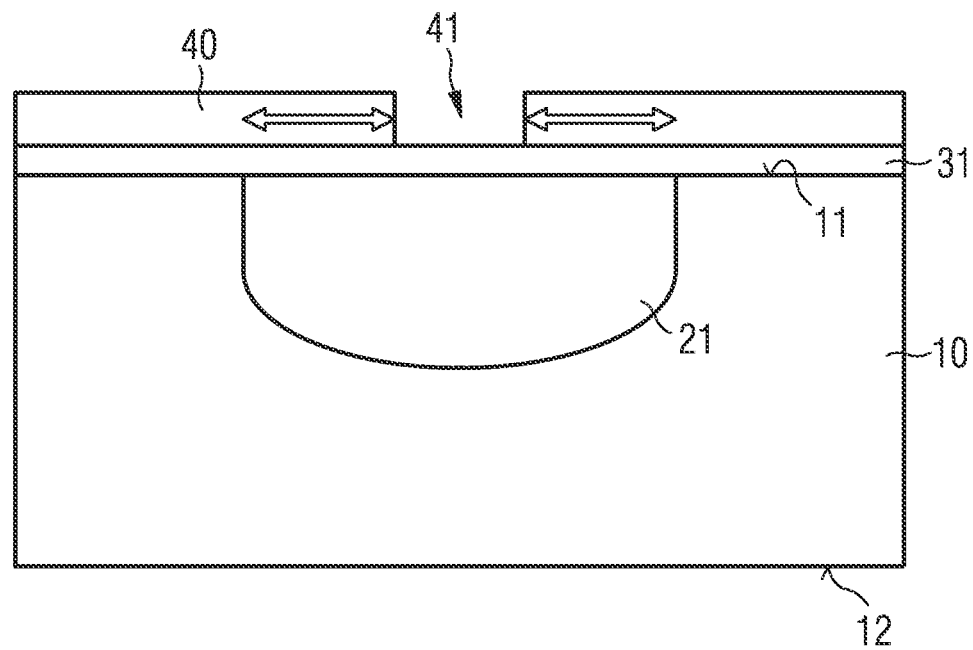
FIGS. 1A to 1C illustrate processes of a method for manufacturing a semiconductor device according to one embodiment.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", leading", "trailing" etc., is used with reference to the orientation of the Figure(s) being described. Because components of embodiments can be positioned in a number of different orientations, the directional terminology is used for purpose of illustration and is in no way limiting. Other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

Features of the various exemplary embodiments described herein may be combined with each other, unless specifically noted otherwise. For example, features illustrated or described as part of one embodiment can be used in conjunction with features of other embodiments to yield yet a further embodiment. It is intended that the present description includes such modifications and variations.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a relative location of a structural feature to another structural feature with consideration of this orientation.

When referring to semiconductor devices, at least two-terminal devices are meant, an example is a diode. Semiconductor devices can also be three-terminal devices such as a bipolar transistor or a field-effect transistor (FET), insulated gate bipolar transistor (IGBT), junction field effect transistors (JFET), and thyristors to name a few. The semiconductor devices can also include more than three terminals. According to an embodiment, semiconductor devices are power devices. Integrated circuits include a plurality of integrated devices.

The terms "electrically connected" and "electrical connection" intends to describe that there is an ohmic contact between to elements or structures.

Specific embodiments described herein pertain to, without being limited thereto, semiconductor devices with at least one, typically with two or more bipolar transistors.

Figure 1B:
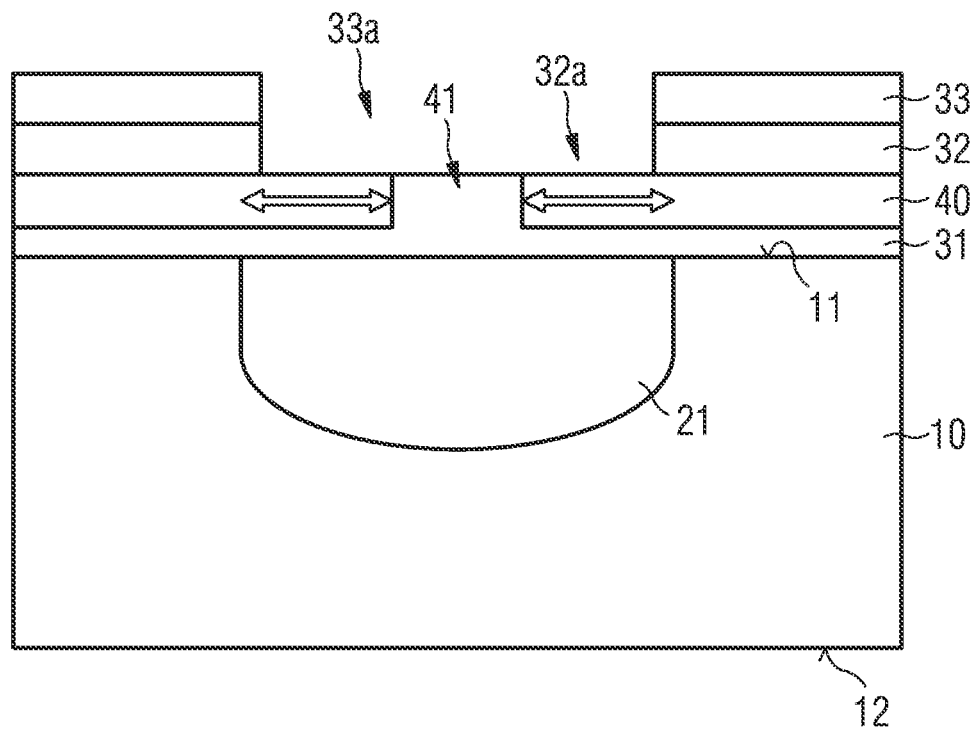
Figure 1C:
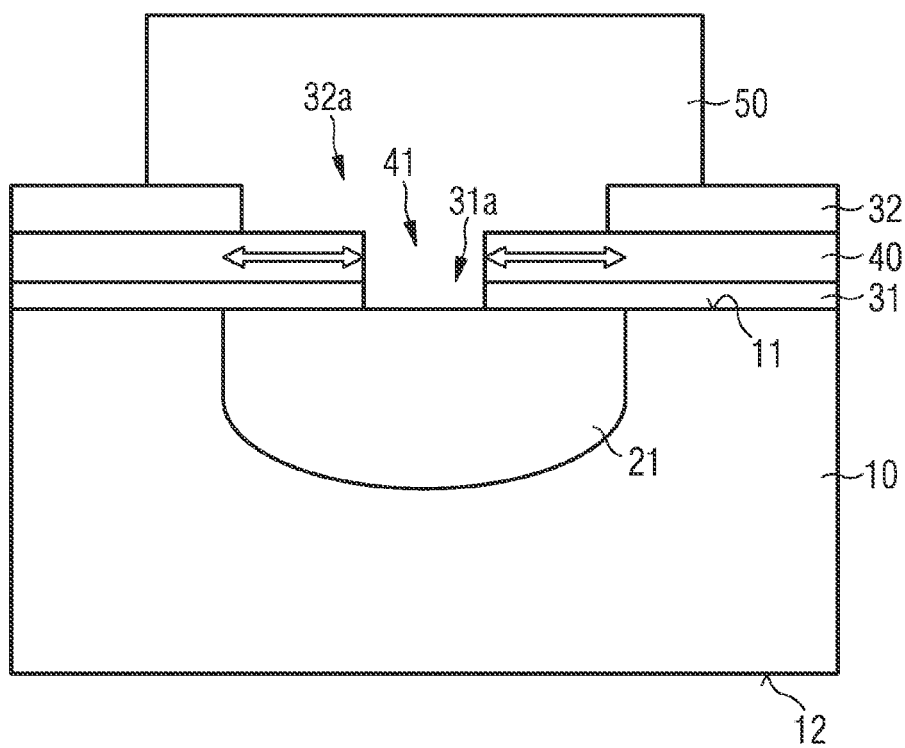

With reference to FIGS. 1A to 1C, a first embodiment of a method for manufacturing a semiconductor device is described. A semiconductor substrate or wafer 10 is provided having a first surface 11 and a second surface 12 arranged opposite the first surface 11. The semiconductor substrate or wafer 10 can be made of any semiconductor material suitable for manufacturing semiconductor devices. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide The semiconductor substrate 10 can include an n-doped doping area. Semiconductor substrate 10 can also be formed by an n-doped epitaxial layer formed on a p-doped wafer. For the purpose of illustration and not meant as limitation, n-type is referred to as first doping type while p-type is referred to as second doping type. A skilled person will appreciate that reverse doping conditions can also be applied. For the purpose of illustration in this embodiment, semiconductor substrate 10 is n-doped.

A first insulating layer 31 is formed on the first surface 11 of the semiconductor substrate 10, for example by thermal oxidation or deposition. A mask layer 40 is formed on the first insulating layer 31. Mask layer 40 includes at least one opening 41, which is referred to as first opening 41. First opening 41 can be formed by using a photo mask (not shown). Mask layer 40 can be a hard mask layer. According to an embodiment, mask layer 40 can be comprised of an electrically conductive material. Examples are polysilicon and chromium silicide (CrSi$_2$). Mask layer 40 can be a polysilicon field plate which is used in other regions of semiconductor device as field plate, for example in lateral termination structures. According to an embodiment, mask layer 40 can by comprised of a dielectric material.

First insulating layer 31 can be comprised of a material which can be etched selectively with respect to the mask layer 40.

Mask layer 40 is used for forming a first doping region 21 of second conductivity type, which is p-doped in this embodiment. Mask layer 40 is used as implantation mask with opening 41 defining the location of the first doping region 21. Dopants can be implanted through first insulating layer 31 which will serve as scatter oxide to prevent channeling during implantation. Alternatively, implantation can be done without first insulating layer 31 which can be etched selectively with respect to mask layer 40 to expose the first surface 11 of the semiconductor substrate 10 before implantation.

The implantation process can be carried out such that substantially no dopants penetrate mask layer 40. Hence, implantation into the semiconductor substrate 10 occurs only in the region of the first opening 41. To this end, the implantation energy can be appropriately selected. Implantation of dopants using mask layer 40 as implantation mask results in the formation of the first doping region 21 in a self-aligned manner with respect to the first opening 41 of mask layer 40.

First doping region 21 can be annealed which typically results in a further diffusion of the implanted dopants into the semiconductor substrate 10. Furthermore, implantation damages are annealed. The resulting structure is illustrated in FIG. 1A showing the first doping region 21 self-aligned, i.e. centred with respect to the opening 41 of mask layer 40.

The term self-aligned intends to describe that the structures are laterally aligned with respect to each other. Particularly, the structures are laterally centred with respect to each other. FIG. 1A shows that the centre of the first doping region 21 is on the same vertical line as the centre of the first opening 41 when seen in a vertical cross-section. The lateral distance between a first outer edge of the first doping region 21 to a first edge of the first opening 41 is the same as the lateral distance between a second outer edge of the first doping region 21 to a second edge of the first opening 41 when seen in the vertical cross-section. The respective lateral distances are illustrated by arrows in FIG. 1A. In a plan view onto the first surface of the semiconductor substrate, first doping region 21 also appears centred with respect to first opening 41 of mask layer 40.

In a further process, a second insulating layer 32 is formed on the mask layer 40 to cover the first opening 41 of the mask layer 40. Second insulating layer 32 can be comprised of a material which can be etched selectively with respect to the mask layer 40. For example, second insulating layer 32 can be comprised of the same material as first insulating layer 31. First and second insulating layers 31, 32 can be made of silicon oxide, for example.

An etching mask 33, for example a resist mask, is formed on the second insulating layer 32. Etching mask 33 includes an opening 33a which defines the location of a first opening 32a to be formed in the second insulating layer 32. The opening 33a of etching mask 33 is arranged above the first opening 41 of the mask layer 40 and has a lateral extension which is larger than the lateral extension of the first opening 41 of the mask layer 40 to ensure that the first opening 41 in the mask layer 40 becomes fully exposed.

As opening 33a of the etching mask 33 is larger than the first opening 41 of mask layer 40, misalignment of etching mask 33 with respect to mask layer 40 is uncritical. To ensure that first opening 41 of mask layer 40 is fully covered by opening 33a of etching mask 33 when seen in a projection onto the first surface 11 of the semiconductor substrate 10, the size of opening 33a of etching mask 33 should take account of possible misalignment tolerances. The subsequently formed first opening 32a of second insulating mask 32 has therefore a lateral extension which is larger than the lateral extension of first opening 41 in the mask layer 40 and completely exposes first opening 41 of mask layer 40.

The first opening 32a of the second insulating layer 32 is formed using an etching process, which can be selective with respect to the material of the mask layer 40 and the material of the etching mask 33. FIG. 1B illustrates an intermediate stage during etching. The etching results in a removal of the material of the second insulating layer 32 within the region defined by opening 33a of the etching mask 33. Since opening 33a is larger than opening 41 of mask layer 40, portions of mask layer 40 arranged adjacent to first opening 41 are also exposed, i.e. first opening 41 of mask layer 40 is completely exposed. The etching also results in the formation of a step defined by the first opening 41 of mask layer 40.

When etching progresses, material of the second insulating layer 32, which fills the first opening 41 of mask layer 40, will be removed together with material of the first insulating layer 31. As etching is selective with respect to the material of the mask layer 40, partially exposed mask layer 40 functions as etching mask for the first insulating layer 31. Hence, a first opening 31a is formed in the first insulating layer 31. First opening 31a is aligned with respect to the first opening 41 of mask layer 40 and thus also with first doping region 21.

Alternatively, first opening 31a of first insulating layer 31 can be etched before implantation. In a further alternative, first opening 31a can be etched after implantation and before formation of the second insulating layer 32. In either case, mask layer 40 serves as etching mask. According to an embodiment, first opening 31a in the first insulating layer 31 is formed together with first opening 32a of the second insulating layer 32 by a common etching process.

In a further process, a conductive material is deposited to form at least one contact element 50. Contact element 50 is in electrical contact with the first doping region 21 and extends from the surface of, and fills, the first doping region 21 through the first opening 31a in the first insulating layer 31, through the first opening 41 in the mask layer 40 and through the first opening 32a in the second insulating layer 32. The contact element 50 is also in contact with the mask layer 40, particularly with the exposed portions adjacent to the first opening 41.

A contact area between the contact element 50 and the first doping region 21 is therefore also laterally aligned with first doping region 21. The contact element 50 can be centred with respect to the first doping region 21. This is beneficial for example when considering a bipolar transistor. First doping region 21 can form, for example, the emitter of the bipolar transistor while contact element 50 can form an emitter contact. Since both are centred with respect to each other, the emitter efficiency is improved unlike devices formed by other processes which do not employ a self-adjusted formation of the emitter contact with respect to the emitter. Self-adjusted formation is due to the use of mask layer 40, which forms an implantation mask for the first doping region 21 and an etching mask for etching the first insulating layer 31.

The self-aligned formation of the emitter contact and emitter maintains the emitter width and therefore improves the emitter efficiency. Furthermore, process variations are significantly reduced since both the first doping region 21 and the contact element 50 are aligned with respect to each other irrespective of any misalignment between separate lithographical mask. As described above, mask layer 40 is the only mask used to define the location of first doping region 21 (for example emitter) and the contact element 50 (for example emitter contact). Misalignment between first doping region 21 and contact element 50 is therefore avoided. In other words, mask layer 40 is used to form a self-aligned contact opening with respect to the first doping region 21.

Figure 2A:
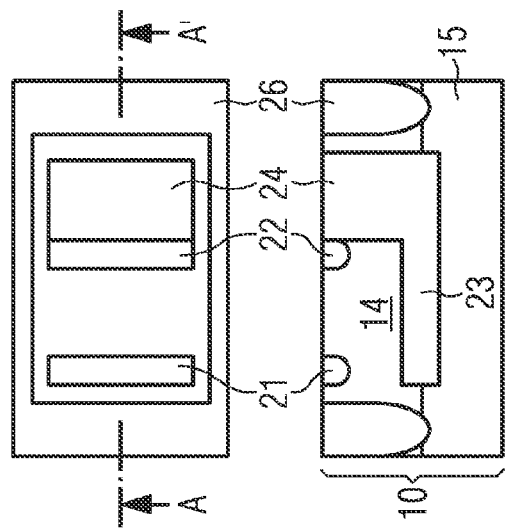
FIGS. 2A to 2C illustrate the design of lateral bipolar transistors according to several embodiments.
Figure 2B:
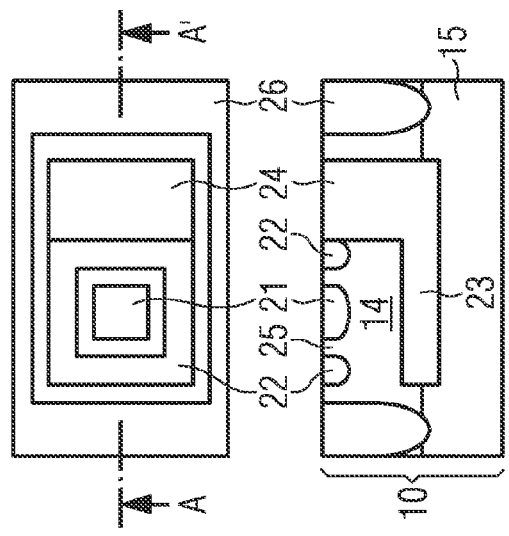
Figure 2C:
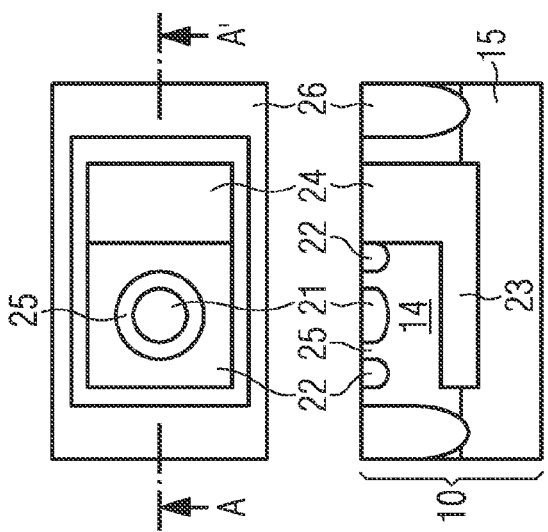

FIGS. 2A to 2C illustrate the layout design of planar bipolar transistors according to several embodiments. The upper illustrations of FIGS. 2A to 2C show respective plan views onto the first surface 11 of the semiconductor substrate 10 while the lower illustrations of FIGS. 2A to 2C show respective cross-sectional views along line AA'. For the sake of illustration purposes only and not meant as limitation, FIGS. 2A to 2C show pnp-bipolar transistors. All details given herein also apply to npn-bipolar transistors.

FIG. 2A illustrates a lateral pnp-bipolar transistor having a rotationally symmetric layout. A circular emitter region 21 is formed in a central region of the bipolar transistor surrounded by a rotationally symmetric p-doped collector 22. P-doped collector 22 and p-doped emitter 21 are laterally spaced apart from each other by n-doped base region 25 which is formed by n-doped epitaxial region 14 arranged on p-doped wafer 15. N-doped Epitaxial region 14 and p-doped wafer 15 together form semiconductor substrate 10. Base region 25 is contacted through buried n-doped region 23 and n-doped region 24 which is also referred to as "n-sinker". The bipolar transistor is laterally surrounded by p-doped device isolation 26 which extends up to the p-doped wafer 15.

Lateral bipolar transistors do not have to be circular-rotationally symmetric as illustrated in FIG. 2A, but can have other layout designs as well. FIG. 2B illustrates a rotationally symmetric design (rotationally symmetric with respect to a rotation of about 90°) with a central emitter 21 having a quadratic shape surrounded by collector 22. Hence, collector region 22 forming a second doping region laterally surrounds, in a plan view onto the first surface of the semiconductor substrate 10, emitter region 21 forming a first doping region.

FIG. 2C illustrates a lateral bipolar transistor having a bar-shaped emitter 21 and a bar-shaped collector 22 spaced apart from emitter 21. A skilled person will appreciate that lateral pnp-transistors can have different layouts which may be selected according to specific needs.

With respect to FIGS. 3A to 3E a further embodiment of a method for manufacturing a semiconductor device having a lateral pnp-transistor is described. Similar as described in connection with FIGS. 1A to 1C, a semiconductor substrate 10 such as a silicon substrate is provided having a first surface 11 and a second surface 12. Semiconductor substrate 10 includes a p-doped wafer 15 forming the second surface 12 and an n-doped epitaxial layer 14 forming the first surface 11 of the semiconductor substrate 10. N-doped buried region 23 is formed at the interface (pn-junction) between p-doped wafer 15 and n-doped epitaxial layer 14 and connected by n-sinker 24. P-doped device isolations 26 laterally surround the region of the bipolar transistor.

In some embodiments, buried region 23 and sinker 24 are highly n-doped while epitaxial layer 14 is lightly n-doped. Wafer 15 is lightly p-doped while device isolations 26 are highly p-doped.

First insulating layer 31 is formed on the first surface 11 of the semiconductor substrate 10, for example by thermal oxidation resulting in the formation of a silicon oxide layer. Mask layer 40 is then form as described above. Mask layer 40 includes a first opening 41 defining the location of a subsequently formed emitter region. Mask layer 40 also includes a second opening 42 laterally spaced from first opening 41. Second opening 42 can surround the first opening 41 to obtain a bipolar transistor having a collector region surrounding the emitter region. Second opening 42 can be defined by mask layer 40 together with an auxiliary mask layer 45 having a large opening for exposing mask layer 40. An "inner rim" of auxiliary mask layer 45 defines "outer edges" of the second opening while an "outer rim" of mask layer 40 defines "inner edges" of the second opening 42.

Figure 4A:
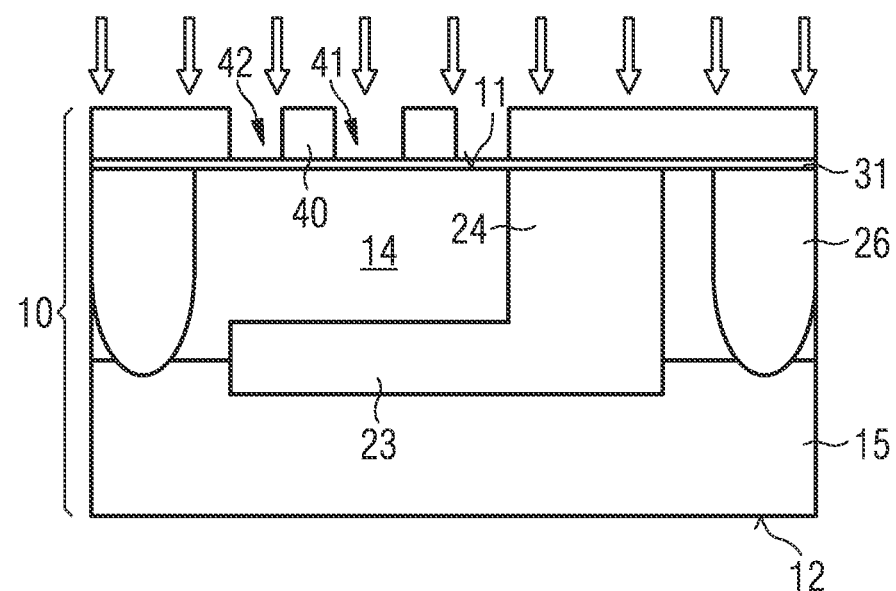
FIGS. 4A to 4C illustrate processes of a method for manufacturing a semiconductor device according to one embodiment.

Alternatively, as illustrated in FIG. 4A, mask layer 40 can be used without auxiliary mask layer 45. FIG. 4A shows that second opening 42 is formed in mask layer 40 only.

The second opening 42 defines the location of a second doping region which will form the collector region. Collector region can surround the emitter region or can be laterally spaced from the emitter region.

Mask layer 40 can be comprised of a conductive material such as doped polysilicon. When using a conductive material for mask layer 40, first insulating layer 31 is used to insulate conductive mask layer 40 from the semiconductor substrate 10. When mask layer 40 is comprised of an insulating material, first insulating layer 31 can be omitted.

Figure 3A:
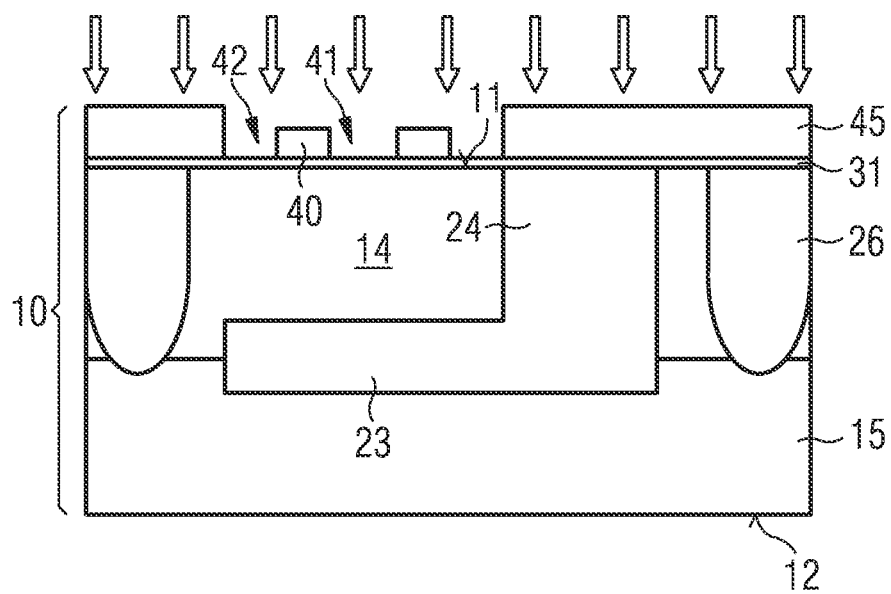
Figure 3B:
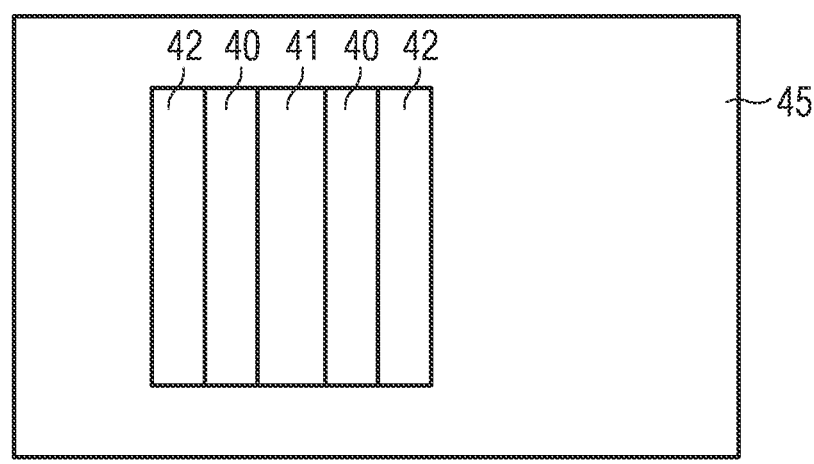
Figure 4B:
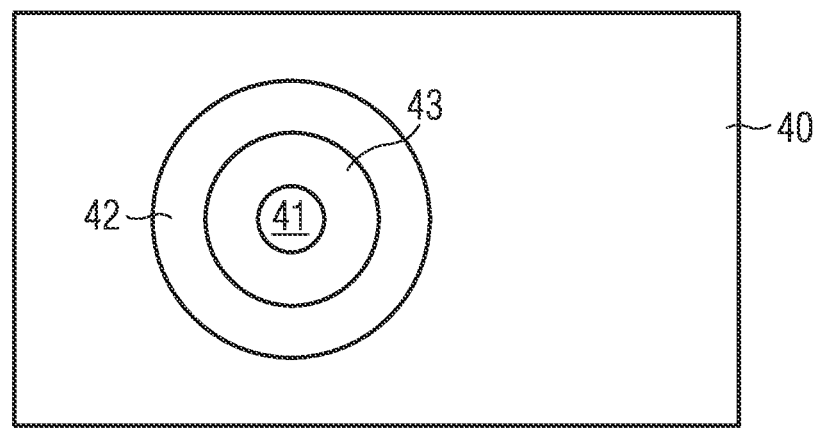

Dopants are implanted into the semiconductor substrate 10 using mask layer 40 as an implantation mask. The first opening 41 of mask layer 40 defines the location of emitter region 21 as illustrated in FIG. 3B while second opening 42 defines the location of collector region 22. FIG. 3A uses a combined implantation mask formed by mask layer 40 and auxiliary mask layer 45 while FIG. 4A uses only mask layer 40 as an implantation mask. For example, when using a "lateral" layout design as illustrated in FIG. 2C, a combined implantation mask as shown in FIG. 3B can be used. When using a rotationally symmetric layout as illustrated in FIGS. 2A and 2B, no additional auxiliary mask layer is needed and mask layer 40 is only used. FIG. 4B illustrates the layout of mask layer 40 used for forming the layout design of FIG. 2A with first opening 41 being a central opening surrounded by a ring-shaped second opening 42 which is separated from first opening 41 by a ring-shaped mask portion 43 of mask layer 40.

Figure 3C:
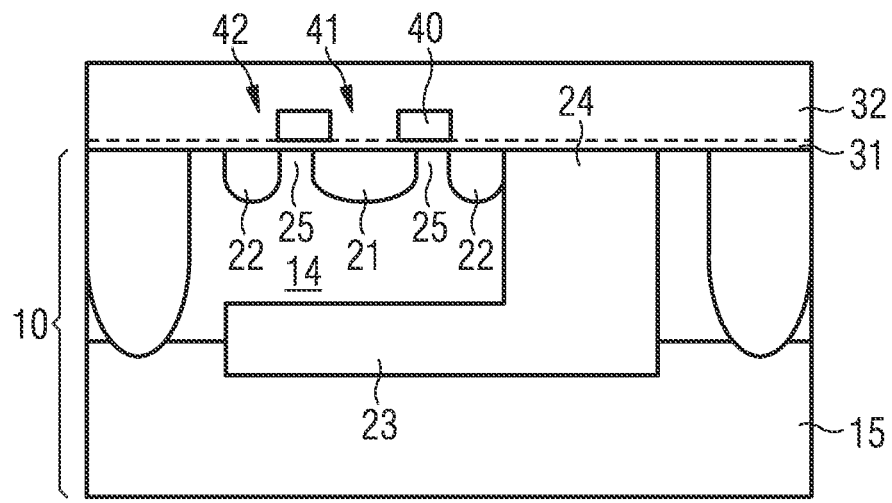

First doping region 21 (emitter) and second doping region 22 (collector) are formed by a common implantation process as illustrated in FIG. 3C. The first and second doping regions 21, 22 are highly p-doped regions in this embodiment. The implantation energy is selected such that the dopants do not penetrate mask layer 40 and auxiliary mask layer 45.

Figure 4C:
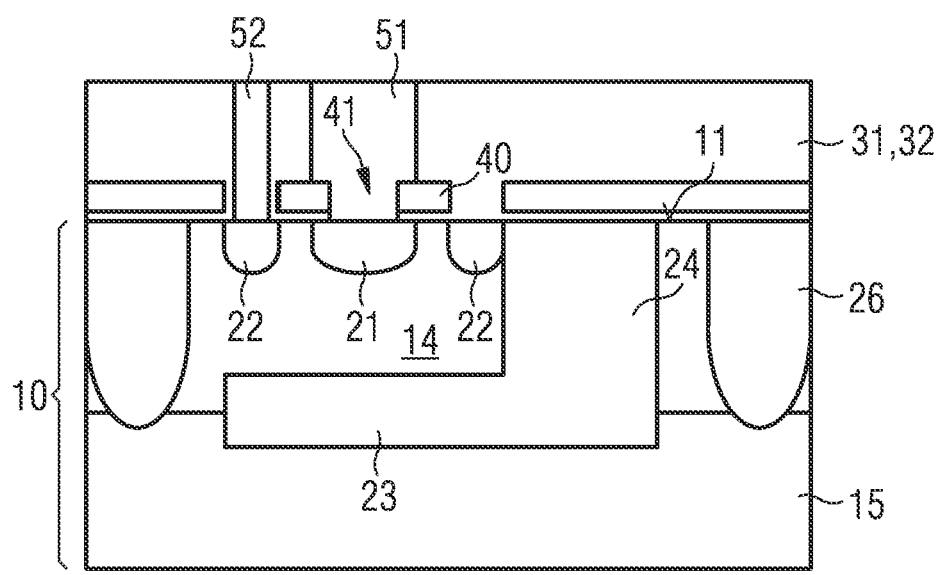

After removal of auxiliary mask layer 45 in the case of FIG. 3C, second insulating layer 32 is deposited. In the case of the processes as illustrated in FIGS. 4A to 4C, no mask removal step is included since no auxiliary mask layer 45 was used. Second insulating layer 32 can be made of the same material as first insulating layer 31 to form an insulating layer embedding conductive mask layer 40. In FIG. 3C, the interface between the first and second insulating layers 31, 32 is indicated by a dashed line.

In a further process, etching mask 33 is formed on second insulating layer 32. Etching mask 33 includes a first opening 33a arranged above first opening 41 of the conductive mask layer 40. A second opening 33b is formed above second doping region 22 while a third opening 33c is formed above n-sinker 24. Second and third openings 33b, 33c, which can be referred to as contact openings, are arranged such that they are not above portions of mask layer 40 when seen in a projection onto first surface 11. This is to ensure that the openings formed subsequently into the first and second insulating layers 31, 32 do not cover or border mask layer 40 so that the openings and the conductive material deposited in a later process are insulated from conductive mask layer 40.

First opening 33a of etching mask 33 has a larger lateral width than first opening 41 of mask layer 40 as described above to ensure that the first opening 41 is fully exposed and can function as an etching mask.

Figure 3D:
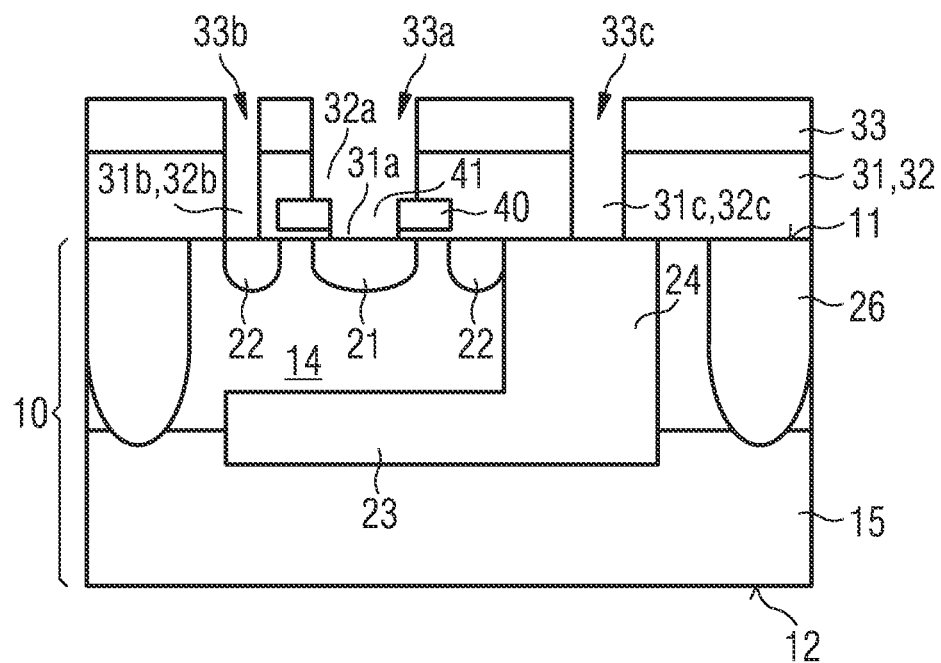

In a further process, second and first insulating layers 32, 31 are etched in a common etching process which is selective with respect to the material of mask layer 40. First opening 32a of second insulating layer 32 completely exposes first opening 41 of mask layer 40 which defines the location and size of the first opening 31a of first insulating layer 31 as described above. Second opening 31b, 32b of first and second insulating layers 31, 32 extend to second doping region 22 while third opening 31c, 32c of first and second insulating layers extend to n-sinker 24. Second opening 31b, 32b and third opening 31c, 32c of first and second insulating layers 31, 32 are laterally spaced from mask layer 40. The resulting structure is shown in FIG. 3D.

FIG. 3E illustrates the structure after removal of etching mask 33 and deposition of a conductive material which forms a first contact element 51 in the first opening 31a, 32a of first and second insulating layers and first opening 41 of mask layer 40. Due to the partially exposed mask layer 40 within first opening 32a of second insulating layer 32, which results in the formation of a step, first contact element 51 makes contact to mask layer 40 not only on the sidewalls of first opening 41 but also on the upper surface of mask layer 40. This improves the electrical contact between the first contact element 51 and mask layer 40.

First contact element 51 has therefore a lower portion having a smaller lateral extension than an upper portion with a step portion formed between the upper and lower portions. The lower portion is disposed in the first insulating layer 31 and mask layer 40. The upper portion is disposed in the second insulating layer 32. The first and second insulating layers 31, 32 embed mask layer 40. First contact element 51 can also be referred to as a plug.

A second contact element 52 is formed in the second opening 31b, 32b of the first and second insulating layers 31, 32 and a third contact element 53 is formed in the third opening 31c, 32c of the first and second insulating layers 31, 32. Second and third contact elements 52, 53 have a column-like shape and do not include a step portion unlike first contact element 51 since mask layer 40 is spaced apart from these contact elements. Second and third contact elements 52, 53 can also be referred to as plugs. First, second and third contact elements 51, 52, 53 can be comprised of tungsten or other suitable conductive material(s).

Figure 3F:
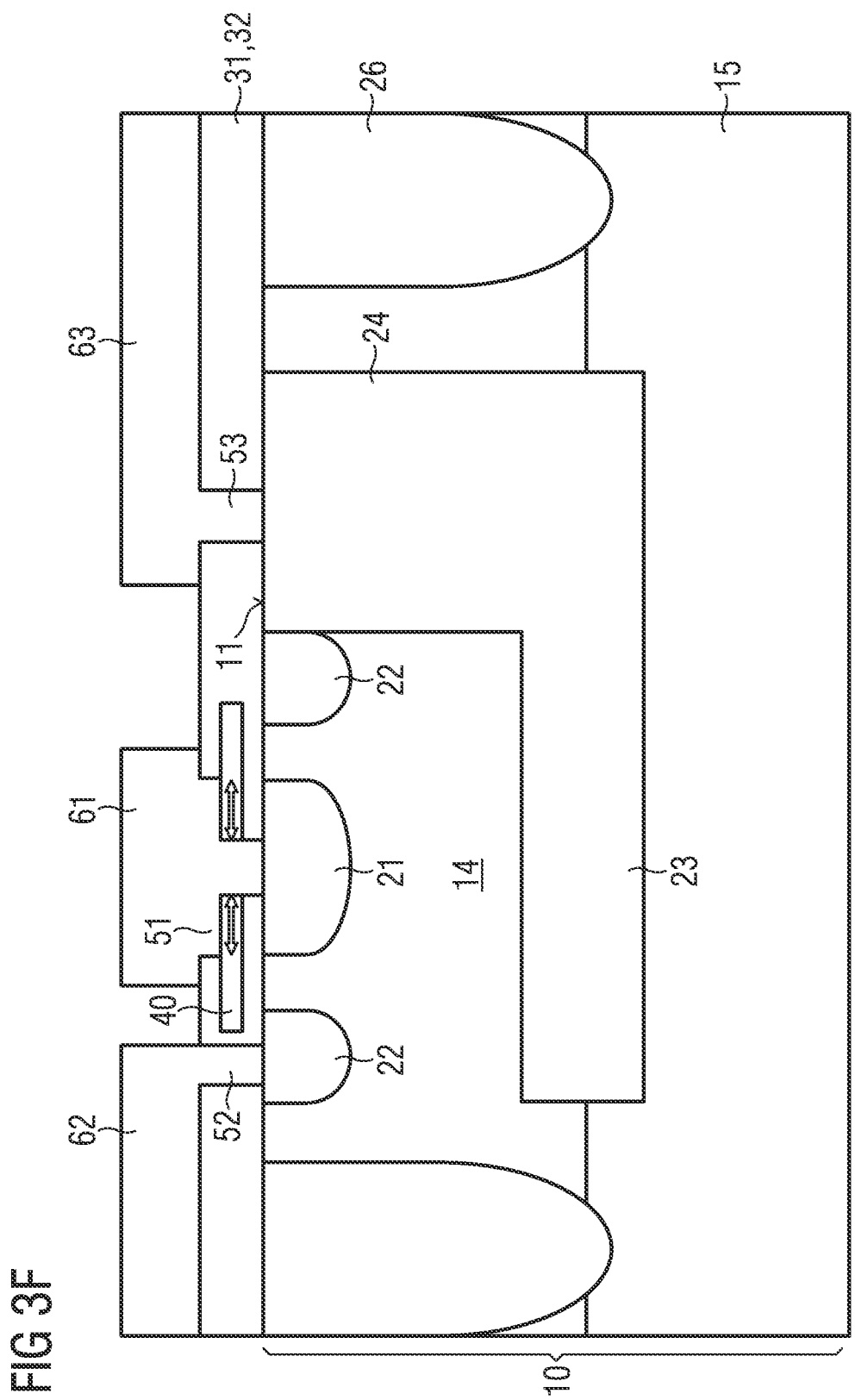

In further processes, metallization regions 61, 62, 63 are formed on second insulating layer 32 as illustrated in FIG. 3F. Metallization region 61 is in electrical contact with the first contact element 51, metallization region 62 is in electrical contact with the second contact element 52 while metallization region 63 is in electrical contact with the third contact element 53. Metallization regions 61, 62, 63 can be comprised of aluminium or other suitable conductive material(s).

Alternatively, first, second and third contact elements 51, 52, 53 can be formed together with first, second and third metallization regions. For example, aluminium can be sputtered to fill openings 33a, 33b, 33c and to form a metal layer on second insulating layer. The metal layer is subsequently structured to form metallization regions 61, 62, 63.

First contact element 51 is formed laterally centred with respect to the first doping region 21 unlike second and third contact elements 52, 53 which do not need to be laterally centred with respect to their doping regions 22 and 24, respectively.

FIGS. 4A to 4C show variations of the processes illustrated in FIGS. 3A to 3F. Different to FIG. 3A. FIG. 4A employs a mask layer 40 having a first opening 41 and a second opening 42 laterally spaced to the first opening 41. Therefore, no auxiliary mask layer is needed. First opening 41 defines the location of the first doping region 21 while second opening defines the location of the second doping region 22 which laterally surrounds the first doping regions 21. Mask layer 40 is shown in a plan view in FIG. 4B as described above.

The remaining steps can be carried out as described in connection with FIGS. 3C to 3F. Since mask layer 40 covers the region of n-sinker as well, an additional etching step can be added to remove mask layer 40 from regions above n-sinker 24. As shown in FIG. 4C, first contact element 51 is centred with respect to first doping region 21 e.g. forming the emitter. Moreover, first contact element 51 is in direct contact with mask layer 40. Second contact element 52 is insulated from mask layer 40 to prevent a short between first and second doping regions 21, 22.

Figure 5:
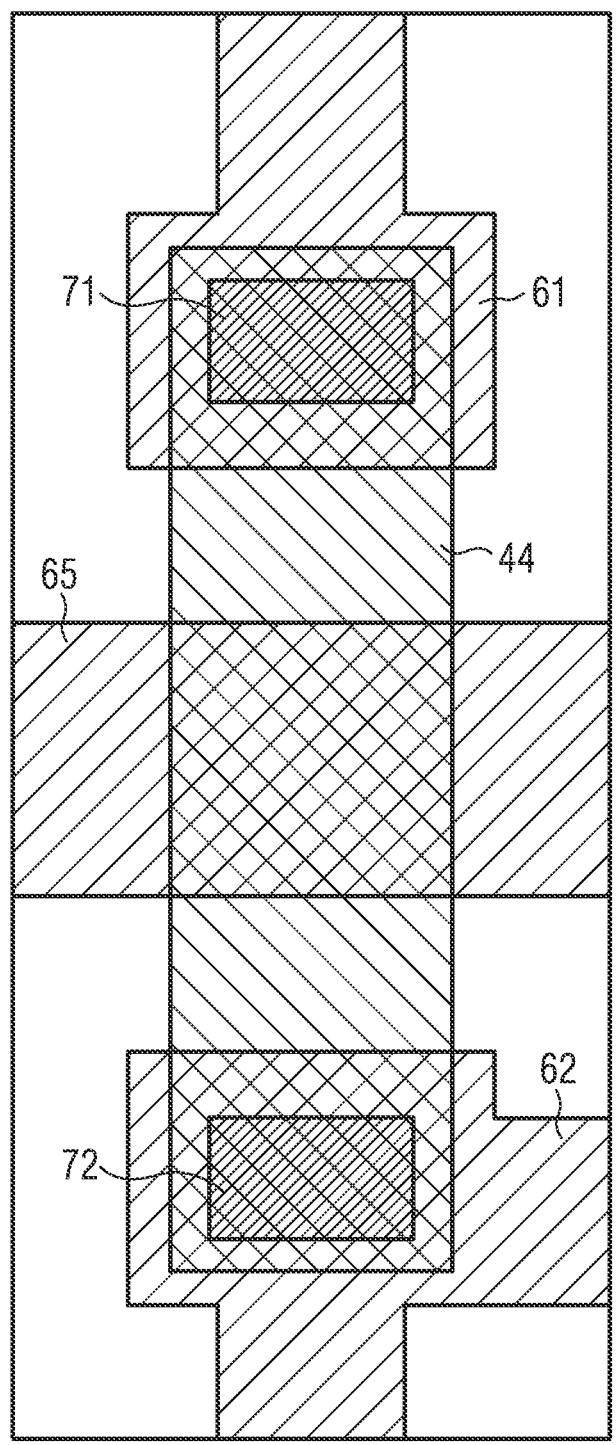
FIG. 5 illustrates the layout of an electrical connection according to an embodiment.

FIG. 5 illustrates a plan view of a local wiring of a semiconductor device according to an embodiment. The local wiring includes first and second vias 71, 72. A portion 44 of a conductive mask layer electrically connects first and second vias 71, 72 which are further in electrical connection with first and second metallization regions 61, 62. Conductive mask layer 44 crosses a metal line 65.

Figure 6:
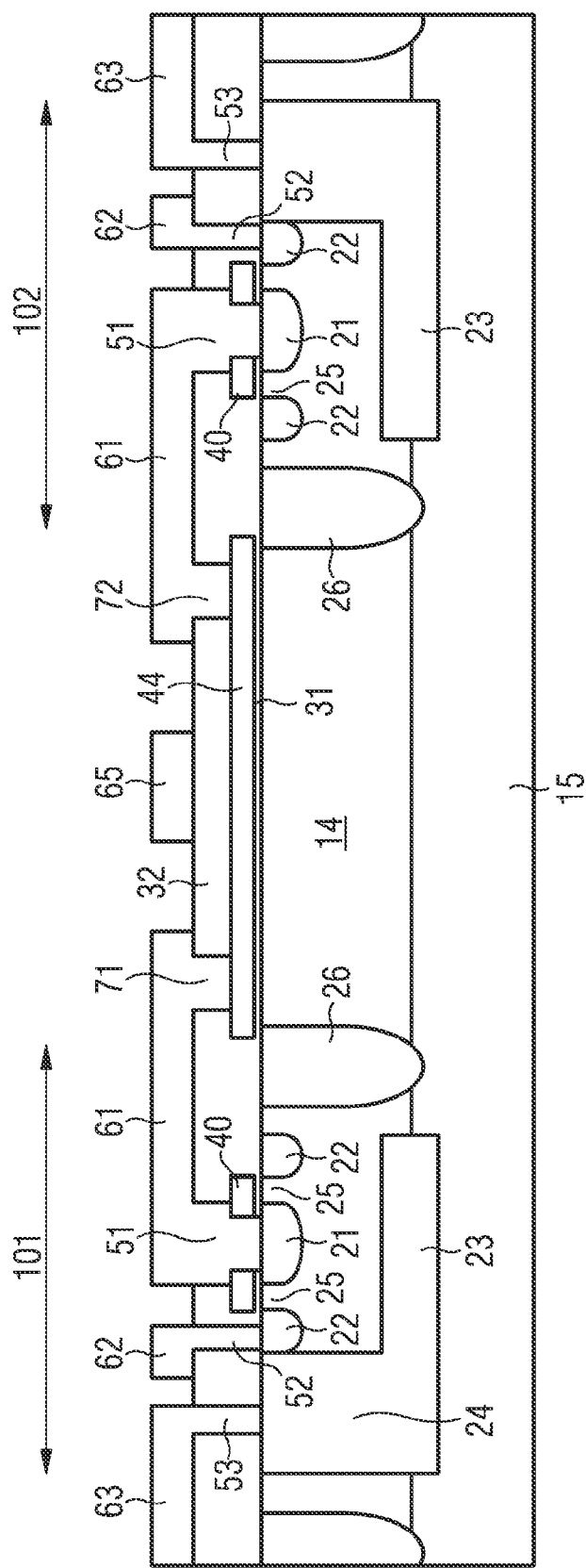
FIG. 6 illustrates a semiconductor device having two lateral bipolar transistors according to an embodiment.

FIG. 6 illustrates a semiconductor device having two laterally spaced bipolar transistors 101, 102 and a local wiring formed between the emitter contacts of the bipolar transistors as shown in FIG. 5. Each bipolar transistor 101, 102 includes a central first doping region 21 forming an emitter region, a second doping region 22 forming a collector region which laterally surrounds emitter region 21, and a base region 25 arranged between the emitter region 21 and the collector region 22. Each bipolar transistor 101, 102 includes a first contact element 51 that is centred with respect to the respective emitter region 21. Second and third contact elements 52, 53 are not necessarily centred with respect to their respective doping regions. Each of the first contact elements 51 are in electrical connection to a metallization region 61 formed on the second insulating layer 32. Metallization regions 61 are electrically connected with each other through respective vias 71, 72 and portion 44 of a conductive mask layer 40. Portion 44 is insulated from other portions of mask layer 40. Hence, mask layer 40 can also be used for forming a local wiring.

FIG. 6 illustrates that the electrical connection between the two emitter contacts 51 includes metallization portions 61 and vias 71, 72. To increase the integration density, local wiring using portions of conductive mask layer 40 can also be formed as described in connection with FIG. 7.

FIG. 6 also shows that first and second insulating layers 31, 32 can have a direct contact with each other in regions outside of mask layer 40, 44. Furthermore, first and second insulating layers 31, 32 can have openings which extend only through the first and second insulating layers 31, 32 and which are spaced apart from openings formed in mask layer 40. Contact elements 52, 53 are formed in these openings.

Figure 7:
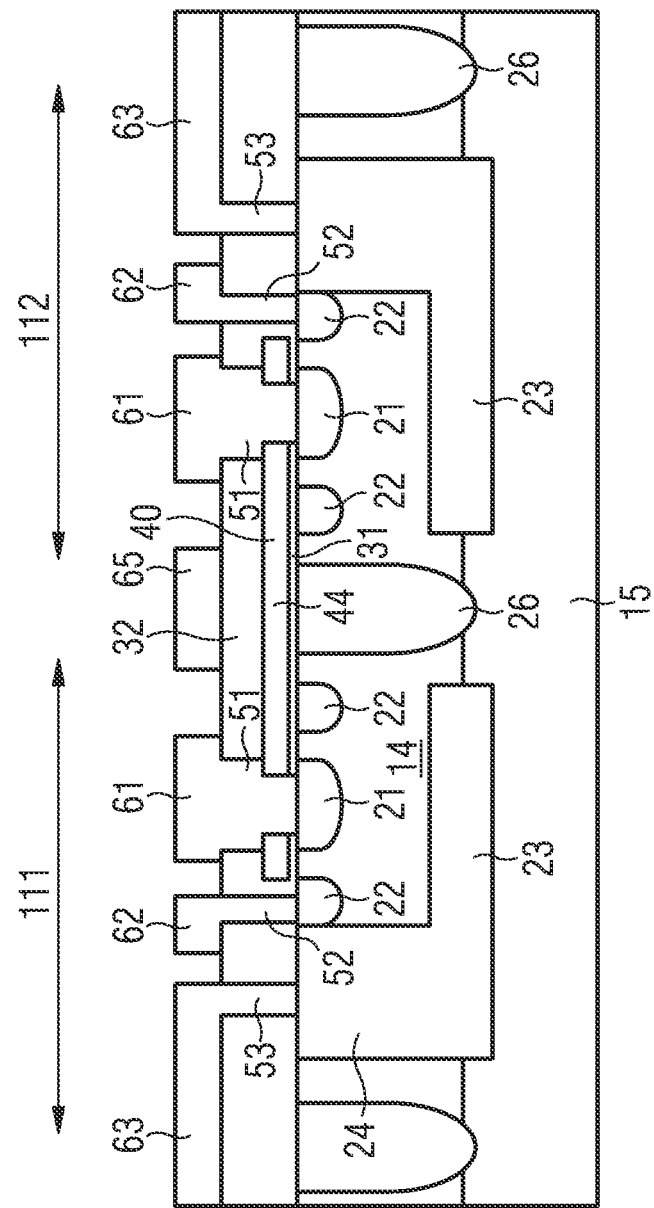
FIG. 7 illustrates a semiconductor device having two lateral bipolar transistors with a local wiring according to an embodiment.

FIG. 7 shows a semiconductor device having two lateral bipolar transistors 111, 112. First and second bipolar transistors 111, 112 substantially have the same arrangements as shown in FIG. 6 except that they are more closely arranged with respect to each other and that there is one device isolation 26 formed between the adjacent bipolar transistors 111, 112. Alternatively, two device isolations 26, which can be arranged more closely together than in FIG. 6, can be arranged between the adjacent bipolar transistors 111, 112 Both transistors 111, 112 include an emitter contact 51 which is centred with respect to an emitter region 21. Both emitter contacts 51 are in direct electrical contact with conductive mask layer 40, a portion 44 of which extends from contact element 51 of the first bipolar transistor 111 to contact element 51 of the second bipolar transistor 112. Hence, an electrical connection between the contact elements 51 is formed without additional metallization portions and vias. This allows reducing the space needed to cross metal line 65.

A skilled person will appreciate that the formation of a local wiring using portion 44 of conductive mask layer 40 is not limited to lateral bipolar transistors but can be used for any device. Hence, the local wiring can include a first contact element 51 centred with respect to a doping region 21 and a second contact element 51 centred with respect to a further doping region 21. The doping regions 21 are laterally spaced from each other. The contact elements 51 extend through a conductive mask layer 40 which is embedded in an insulating layer. Embedding insulating layer can include a first insulating layer 31 below and a second insulating layer 32 above conductive mask layer 40. First and second contact elements 51 include a lower portion extending through the mask layer 40 and an upper portion formed above mask layer 40. A step portion can be formed between the lower and upper portions. The lower portion electrically contacts the respective doping region. Conductive mask layer 40 and contact elements 51 can be made of the same or of different materials. Typically, contact elements 51 are of a different conductive material than conductive mask layer 40. For example, contact elements 51 can be made of a metal or metal silicide while conductive mask layer 40 can be made of polysilicon or metal silicide.

The above described local wiring is particularly useful in devices which only include one polysilicon level and one metallization level such as power devices. The polysilicon "bridge" formed by portion 44 of conductive mask layer 40 starts immediately at the respective device and particularly at a contact element of a doping region of the device.

The local wiring as illustrated in FIG. 7 can be manufactured by forming the first insulating layer 31 and the conductive mask layer 40. Conductive mask layer 40 includes at least two openings which are spaced apart from each other and which both can define the location of respective doping regions 21 which are spaced apart from each other in the finished device. The doping regions 21 are formed using conductive mask layer 40 as an implantation mask. Second insulating layer 32 is formed on conductive mask layer 40 and etched to form at least two openings which completely expose the openings in the conductive mask layer 40. First insulating layer 31 is then etched using conductive mask layer 40 as an etching mask to obtain openings in the first insulating layer 31 which are centred with respect to the doping regions 21. The openings are filled with a conductive material such as metal to form contact elements which are centred with respect to the doping regions and which are in electrical connection with each other using conductive mask 40 as the electrical connection.

The contact element does not necessarily have to be centred with respect to a doping region as described above to serve as contact element of a local wiring. A local wiring can therefore also include a conductive mask layer 40 having two spaced apart openings 41 and contact elements 51 which extend through the openings 41 of the conductive mask layer 40. The contact elements 51 extend to laterally spaced doping regions 21. Furthermore, contact elements 51 can include a step portion between lower and upper portion as described above. The openings 41 of conductive mask layer 40 are used to define the location of the contact elements 51, hence conductive mask layer 40 is used as an etching mask only.

For manufacturing such a local wiring, a semiconductor substrate 10 with respective first doping regions 21 spaced apart from each other can be provided. Then, the first insulating layer 31, mask layer 40 and second insulating layer 32 are formed. Mask layer 40 includes a first opening and a second opening. The first opening is arranged above a first one of the first doping regions 21 while the second opening is arranged above the other doping region 21. Since mask layer 40 is formed after providing of the first doping regions 21, the first and second openings of mask layer 40 are not aligned or centred with respect to the doping regions. In further processes, second insulating layer 32 is etched as described above to form first and second openings and to expose the first and second openings of mask layer 40 which functions as an etching layer when etching progresses to form first and second openings in the first insulating layer 31. The respective first doping regions 21 are thereby at least partially exposed. In further processes, contact elements 51 are formed in the respective openings. Each contact element 51 provides an electrical connection to one of the first doping regions 21 and the contact elements 51 are in electrical contact with mask layer 40. Mask layer 40 can furthermore be used to form contact doping regions in the first doping regions 21. The contact doping regions can have a higher doping concentration than the first doping regions and are typically of the same conductivity type as the first doping regions. Furthermore, the contact doping regions are centred with respect to the openings of the mask layer 40. Formation of contact doping regions is explained in more detail with respect to FIG. 8. Metallization regions in contact with the contact elements 51 can be formed on second insulating layer 32 as described above. The above described local wiring can be formed without additional process costs or only with minor additional costs. Furthermore, the local wiring is space-saving which allows a higher integration density.

Figure 8:
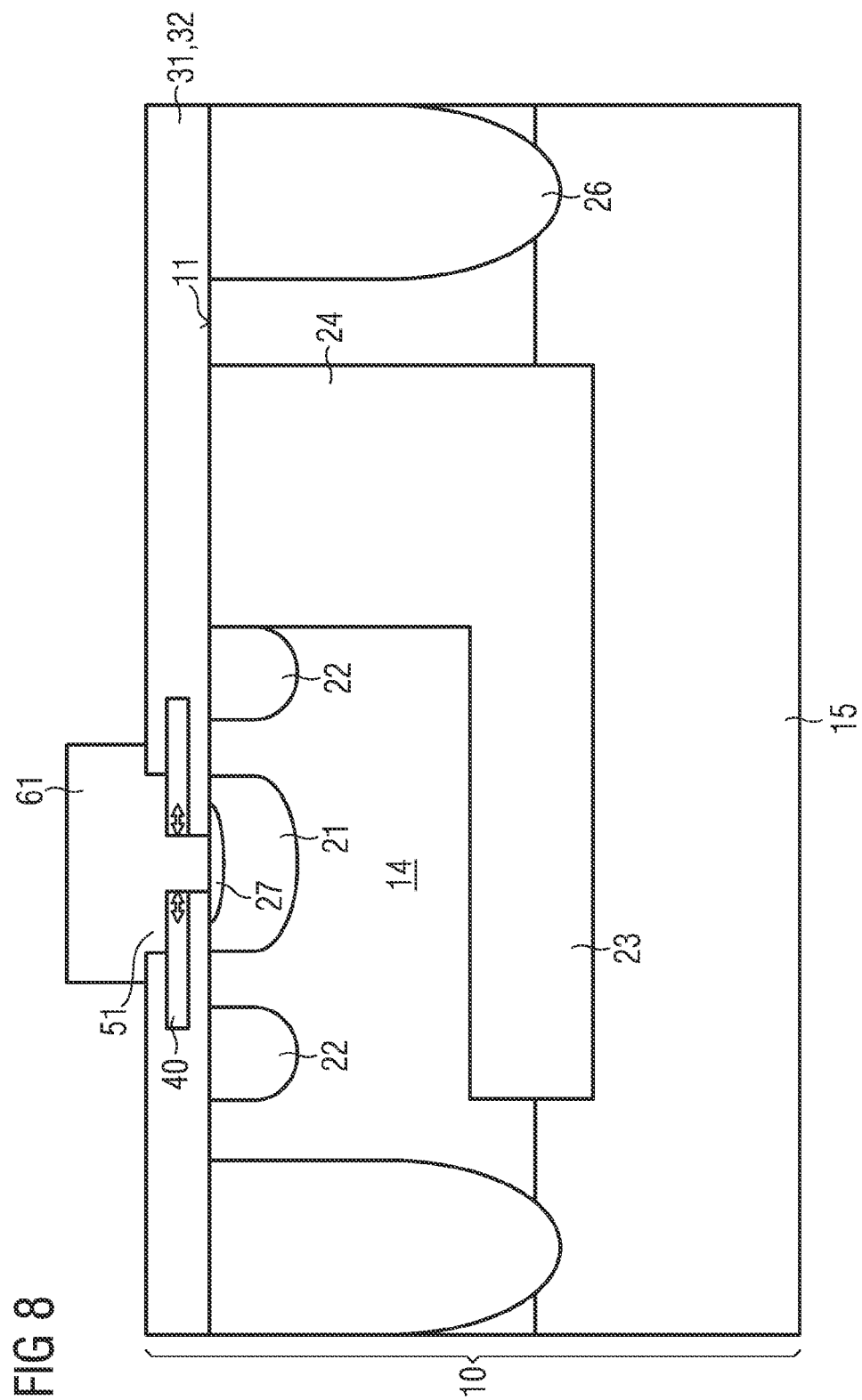
FIG. 8 illustrates a semiconductor device having a lateral bipolar transistor according to an embodiment.

FIG. 8 illustrates a further embodiment of a semiconductor device having a bipolar transistor. The bipolar transistor includes a first doping region 21 which forms here an emitter. The first doping region 21 can be lightly p-doped and formed in an n-doped epitaxial layer 14 of a semiconductor substrate 10. Epitaxial layer 14 forms a doping area of the semiconductor substrate 10. A highly p-doped contact doping region 27 is formed in the first doping region 21 at the first surface 11 of the semiconductor substrate 10. A first insulating layer 31, a mask layer 40, a second insulating layer 32 and a contact element 51 can be formed as described above. Contact element 51 is centred at least with respect to contact doping region 27. Contact element 51 can also be centred with respect to doping region 21. When mask layer 40 is used as an implantation mask for the implantation of the first doping region 21 and the contact doping region 27, both doping regions will be centred with respect to the contact element 51.

The bipolar transistor of FIG. 8 is a high voltage device. To maintain a high blocking voltage, the emitter (first doping region 21) is only lightly doped while contact doping region 27 is highly doped. Since a weekly doped emitter has a low efficiency, the highly doped contact doping region 27 is provided. The location of contact doping region 27 determines the emitter performance. Therefore, contact doping region 27 is centred with respect to contact element 51. First doping region 21 does not need to be centred with contact element 51. Contact doping region 27 also provides a low ohmic contact to the contact element 51. Contact doping region 27 therefore also improves the gain of the bipolar transistor.

The bipolar transistor further includes a second doping region 22 forming a collector region 22 which is also weakly doped to maintain a high blocking voltage.

The bipolar transistor of FIG. 8 can be manufactured in a similar manner as described above. Mask layer 40 can be used for two implantations, namely the implantation of emitter region 21 and contact doping region 27. Contact doping regions in the collector regions can be formed using mask layer 40. Alternatively, contact doping regions in the collector regions can be formed using an auxiliary mask. Furthermore, emitter and collector regions 21, 22 can be implanted by a first implantation using an auxiliary mask as implantation mask which is removed before mask layer 40 is formed for implanting contact doping region 27.

According to one or more embodiments, a method for manufacturing a semiconductor device is provided. The method includes providing a semiconductor substrate comprising a first surface; forming a first insulating layer on the first surface of the semiconductor substrate; forming a mask layer having a first opening on the first insulating layer, the first opening of the mask layer defining a location of a first doping region; performing a first implantation step using the mask layer as implantation mask to form the first doping region in the semiconductor substrate; etching the first insulating layer selectively with respect to the mask layer to expose a portion of the first doping region by forming a first opening in the first insulating layer using the mask layer as etching mask; and depositing a conductive material to form at least one contact element disposed in the first opening of the first insulating layer and in the first opening of the mask layer, the contact element being in contact with the first doping region and the mask layer.

According to one or more embodiments, a semiconductor device is provided. The semiconductor device includes a semiconductor substrate having a first surface and a first doping region. A first insulating layer having a first opening is disposed on the first surface of the semiconductor substrate, wherein the first opening is arranged above the first doping region. A mask layer is disposed on the first insulating layer and includes a first opening, wherein the first opening in the first insulating layer and the first opening in the mask layer are laterally centred with respect to the first doping region. At least a first contact element is arranged in the first opening of the mask layer and the first opening of the first insulating layer. The first contact element electrically connects the first doping region with the mask layer.

According to one or more embodiments, a method for manufacturing a semiconductor device is provided. The method includes providing a semiconductor substrate having a first surface, a first doping region and a second doping region laterally spaced to the first doping region, a first insulating layer on the first surface of the semiconductor substrate, and a conductive mask layer having at least a first opening and a second opening spaced apart from the first opening on the first insulating layer, the first opening of the conductive mask layer being arranged above the first doping region and the second opening of the conductive mask layer being arranged above the second doping region; etching the first insulating layer using the conductive mask layer as etching mask to by form a first and a second opening in the first insulating layer for exposing at least a respective portion of the first and second doping region; and depositing a conductive material to form a first contact element disposed in the first opening of the first insulating layer and the first opening of the conductive mask layer, and a second contact element disposed in the second opening of the first insulating layer and the second opening of the conductive mask layer, the first contact element being in electrical contact with the first doping region and the conductive mask layer, and the second contact element being in electrical contact with the second doping region and the conductive mask layer.

According to one or more embodiments, a semiconductor device is provided. The semiconductor device includes a semiconductor substrate having a first surface, a first doping region and a second doping region laterally spaced apart from the first doping region. A first insulating layer is arranged on the first surface of the semiconductor substrate and includes a first opening and a second opening. A conductive mask layer is disposed on the first insulating layer and has a first opening and a second opening, wherein the first opening of the conductive mask layer is arranged above the first opening of the first insulating layer and the second opening of the conductive mask layer is arranged above the second opening of the first insulating layer. A first contact element is disposed in the first opening of the first insulating layer and the first opening of the conductive mask layer, and a second contact element is disposed in the second opening of the first insulating layer and the second opening of the conductive mask layer, wherein the first contact element is in electrical contact with the first doping region and with the conductive mask layer, and the second contact element is in electrical contact with the second doping region and with the conductive mask layer.

According to one or more embodiments, a semiconductor device is provided. The semiconductor device includes a semiconductor substrate having a first surface, a doping area of a first conductivity type, a first doping region of the second conductivity type arranged in the doping area of the semiconductor substrate, and a contact doping region of the second conductivity type arranged in the first doping region at the first surface, wherein the contact doping region has a higher doping concentration than the first doping region. A first insulating layer is disposed on the first surface of the semiconductor substrate, wherein the first insulating layer includes a first opening above the contact doping region. A mask layer is disposed on the first insulating layer and includes a first opening, wherein the first opening in the first insulating layer and the first opening in the mask layer are laterally centred with respect to the contact doping region. At least one contact element is arranged in the first opening of the mask layer and in the first opening of the first insulating layer, wherein the contact element electrically connects the contact doping region with the mask layer.

According to one or more embodiments, a method for manufacturing a semiconductor device is provided. The method includes providing a semiconductor substrate comprising a first surface; forming an emitter region in the semiconductor substrate; forming a first insulating layer on the first surface of the semiconductor substrate; forming a mask layer comprising a first opening on the first insulating layer, the first opening of the mask layer defining a location of an emitter contact region; performing a first implantation step using the mask layer as implantation mask to form the emitter contact region in the emitter region of the semiconductor substrate; forming a second insulating layer on the mask layer to cover the first opening in the mask layer, the material of the first and second insulating layers being selectively etchable with respect to the material of the mask layer; forming an etching mask on the second insulating layer for defining at least a first opening in the second insulating layer above the first opening of the mask layer; etching the second insulating layer selectively with respect to the etching mask and the mask layer to form the first opening in the second insulating layer, the first opening of the second insulating layer exposing the first opening in the mask layer; etching the first insulating layer selectively with respect to the mask layer to expose a portion of the emitter contact region by forming a first opening in the first insulating layer using the mask layer as etching mask; depositing a conductive material to form at least one contact element disposed in the first opening formed the first insulating layer, the first opening formed in the second insulating layer and the first opening formed in the mask layer, the contact element being in contact with the emitter contact region and the mask layer.

Herein described are methods for manufacturing a semiconductor device according to several embodiments, particularly for manufacturing a lateral bipolar transistor, which employs a conductive mask layer as implantation mask and as etching mask for defining the location of a contact element relative to a doping region formed by implantation. By so doing, adjustment tolerances are avoided and process variations reduced. The conductive mask can be a polysilicon field plate. The doping region can form the emitter region while the contact element can form the emitter contact. An intermediate oxide can be deposited onto the conductive mask layer and than etched. Conductive mask is thereby partially exposed and functions as etch mask. Hence, the thus formed contact opening is aligned with respect to the emitter region. The method also allows formation of area-optimised wirings using self-aligned contact elements and the conductive mask layer as local wiring between contact elements.

Features of the various exemplary embodiments described herein may be combined with each other, unless specifically noted otherwise.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing a bipolar transistor, comprising:
   providing a semiconductor substrate having a first surface;
   forming a first insulating layer on the first surface of the semiconductor substrate;
   forming a mask layer having a first opening on the first insulating layer, the mask layer comprising an electrically conductive material, the first opening of the mask layer defining a location of a first doping region to be formed in the semiconductor substrate, the first doping region being an emitter region of the bipolar transistor;
   performing a first implantation step using the mask layer as an implantation mask to form the first doping region in the semiconductor substrate;
   etching the first insulating layer selectively with respect to the mask layer to expose a portion of the first doping region by forming a first opening in the first insulating layer using the mask layer as an etching mask;
   forming a second insulating layer on the mask layer to cover the first opening in the mask layer, the material of the first and second insulating layers being selectively etchable with respect to the material of the mask layer;
   forming an etching mask on the second insulating layer for defining at least a first opening in the second insulating layer above the first opening of the mask layer;
   etching the second insulating layer selectively with respect to the etching mask and the mask layer to form the first opening in the second insulating layer, the first opening of the second insulating layer exposing the first opening in the mask layer; and
   depositing a conductive material to form at least one contact element disposed in the first opening formed in the first insulating layer, the first opening formed in the second insulating layer and the first opening formed in the mask layer, the contact element being in contact with the first doping region and the mask layer and forming an emitter contact of the bipolar transistor.

2. A method according to claim 1, wherein the first opening in the first insulating layer is etched after etching the first opening in the second insulating layer.

3. A method according to claim 1, wherein the mask layer comprises polysilicon or $CrSi_2$.

4. A method according to claim 1, further comprising:
   forming a second opening in the mask layer laterally spaced apart from the first opening in the mask layer, the second opening in the mask layer defining a location of a second doping region in the semiconductor substrate;
   forming the second doping region in the semiconductor substrate together with the first doping region by implanting the dopants.

5. A method according to claim 4, wherein the second insulating layer covers the second opening in the mask layer, the method further comprising:
   forming a contact opening in the first and second insulating layers, the contact opening extending through the second opening of the mask layer and being laterally spaced apart from the mask layer.

6. A method according to claim 4, wherein the second doping region laterally surrounds the first doping region.

7. A method according to claim 1, further comprising:
forming an auxiliary mask on the first insulating layer, the auxiliary mask defining a second opening of the mask layer laterally spaced apart from the first opening of the mask layer, the second opening defining a location of a second doping region in the semiconductor substrate;
forming the second doping region in the semiconductor substrate together with the first doping region by the first implantation step using the mask layer and the auxiliary mask together as an implantation mask.

8. A method according to claim 1, wherein the first doping region forms an emitter contact region extending to the first surface, the method further comprising:
forming an emitter region of the same conductivity as the emitter contact region, wherein the emitter contact region is embedded in the emitter region and has a higher doping concentration than the emitter region.

9. A method according to claim 1, further comprising:
performing a second implantation step with dopants of the same conductivity type as the first implantation step to form a contact doping region in the first doping region using the mask layer as an implantation mask, the contact doping region having a higher doping concentration than the first doping region.

10. The method of claim 1, wherein depositing the conductive material to form the at least one contact element is carried out after performing the first implantation step.

\* \* \* \* \*